United States Patent
Hezar et al.

(10) Patent No.: US 11,140,478 B2
(45) Date of Patent: *Oct. 5, 2021

(54) LOUDSPEAKER ENHANCEMENT

(71) Applicant: TEXAS INSTRUMENTS INCORPORATED, Dallas, TX (US)

(72) Inventors: Rahmi Hezar, Allen, TX (US); Rajan Narasimha, Dallas, TX (US); Srinath Ramaswamy, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/930,957

(22) Filed: May 13, 2020

(65) Prior Publication Data
US 2020/0275206 A1 Aug. 27, 2020

Related U.S. Application Data

(63) Continuation of application No. 15/584,532, filed on May 2, 2017, now Pat. No. 10,694,289.

(51) Int. Cl.
*H04R 3/04* (2006.01)
*H03F 3/217* (2006.01)
(Continued)

(52) U.S. Cl.
CPC ............... *H04R 3/04* (2013.01); *H03F 1/32* (2013.01); *H03F 3/187* (2013.01); *H03F 3/217* (2013.01); *H03F 2200/03* (2013.01)

(58) Field of Classification Search
CPC .. H04R 3/04; H04R 3/002; H03F 1/32; H03F 3/187; H03F 3/217; H03F 2200/03
(Continued)

(56) References Cited

U.S. PATENT DOCUMENTS 4,943,956 A    7/1990  Noro
5,086,473 A    2/1992  Erath
(Continued)

FOREIGN PATENT DOCUMENTS

CN    102098597 A    6/2011
CN    103369447 A    10/2013
(Continued)

OTHER PUBLICATIONS

Bruno Defraene, et al., "Embedded-Optimization-Based Loudspeaker Precompensation Using a Hammerstein Loudspeaker Model", IEEE/ACM Transactions on Audio, Speech, and Language Processing, vol. 22, No. 11, Nov. 1, 2014, 12 pgs.
(Continued)

*Primary Examiner* — Jason R Kurr
(74) *Attorney, Agent, or Firm* — Mark Allen Valetti; Charles A. Brill; Frank D. Cimino

(57) ABSTRACT

A system for driving an audio speaker that has an impedance, the system comprising: a scaler having an analog input and a scaler output that is an attenuated analog input; an amplifier having an amplifier input coupled to the scaler output and an amplifier output; a current sensor having a sensor input coupled to the speaker and a sensor output, the current sensor configured to generate a sensor signal at the sensor output responsive to a current from the audio speaker; and a compensator circuit having a circuit input coupled to the sensor output and a circuit output coupled to the amplifier input, the compensator circuit configured to supply a compensation signal to the amplifier input by applying a transfer function to the sensor signal.

17 Claims, 13 Drawing Sheets

(51) Int. Cl.
*H03F 1/32* (2006.01)
*H03F 3/187* (2006.01)

(58) Field of Classification Search
USPC .......................................................... 381/96
See application file for complete search history.

(56) References Cited

U.S. PATENT DOCUMENTS

| | | | |
|---|---|---|---|
| 5,430,802 A * | 7/1995 | Page | H04R 3/002 381/59 |
| 8,942,381 B2 | 1/2015 | Gautama | |
| 2006/0104451 A1 | 5/2006 | Browning et al. | |
| 2006/0126857 A1 | 6/2006 | Pavlov et al. | |
| 2007/0269055 A1 | 11/2007 | Erath | |
| 2009/0003628 A1* | 1/2009 | Kirn | H04R 3/007 381/96 |
| 2010/0246848 A1* | 9/2010 | Stanley | H04R 3/002 381/93 |
| 2011/0228945 A1 | 9/2011 | Mihelich et al. | |
| 2012/0154037 A1 | 6/2012 | Pfaffinger et al. | |

FOREIGN PATENT DOCUMENTS

| | | |
|---|---|---|
| CN | 105721982 A | 6/2016 |
| EP | 1806027 A1 | 7/2007 |

OTHER PUBLICATIONS

Varun Chopra, "Active Leak Compensation in Small Sized Speakers Using Digital Signal Processing", Paper, Audio Engineering Society Convention Paper 6605, Oct. 7-10, 2005, 6 pgs.
Benno Krabbenborg, et al., "Closed-Loop Class-D Amplifier with Nonlinear Loop Integrators", IEEE Journal of Solid-State Circuits, vol. 45, No. 7, Jul. 2010, 10 pgs.
Search Report for Application No. 201810390597.3, dated Dec. 3, 2020.

* cited by examiner

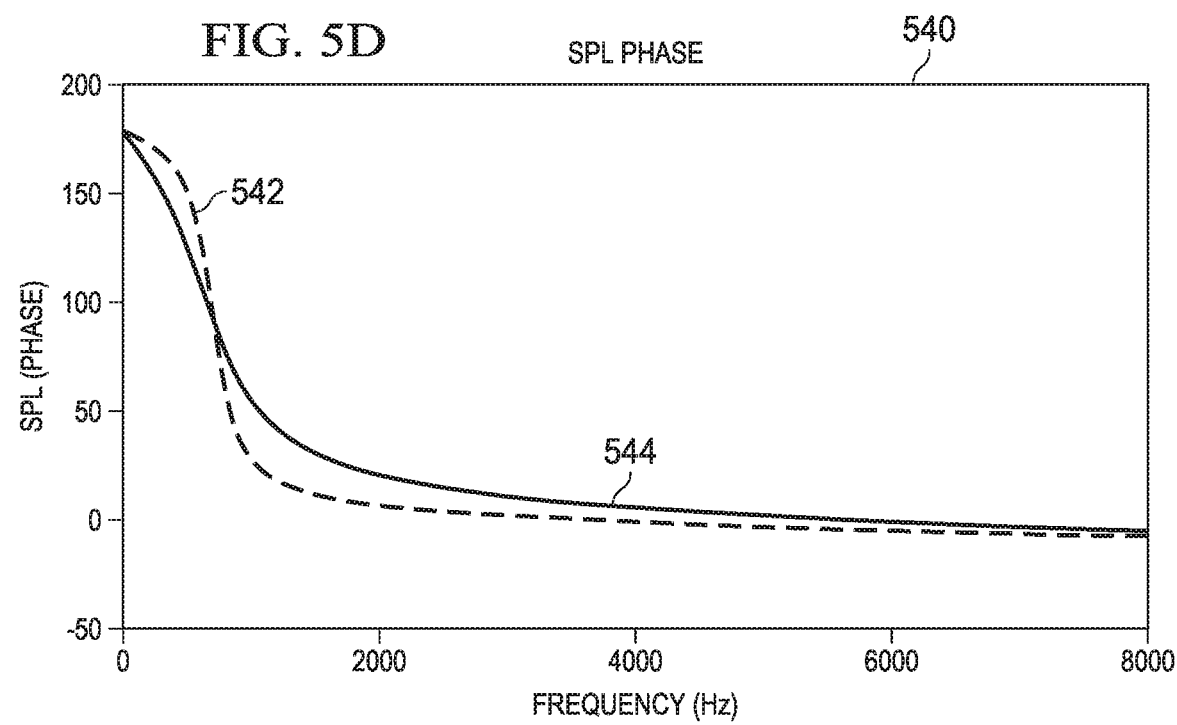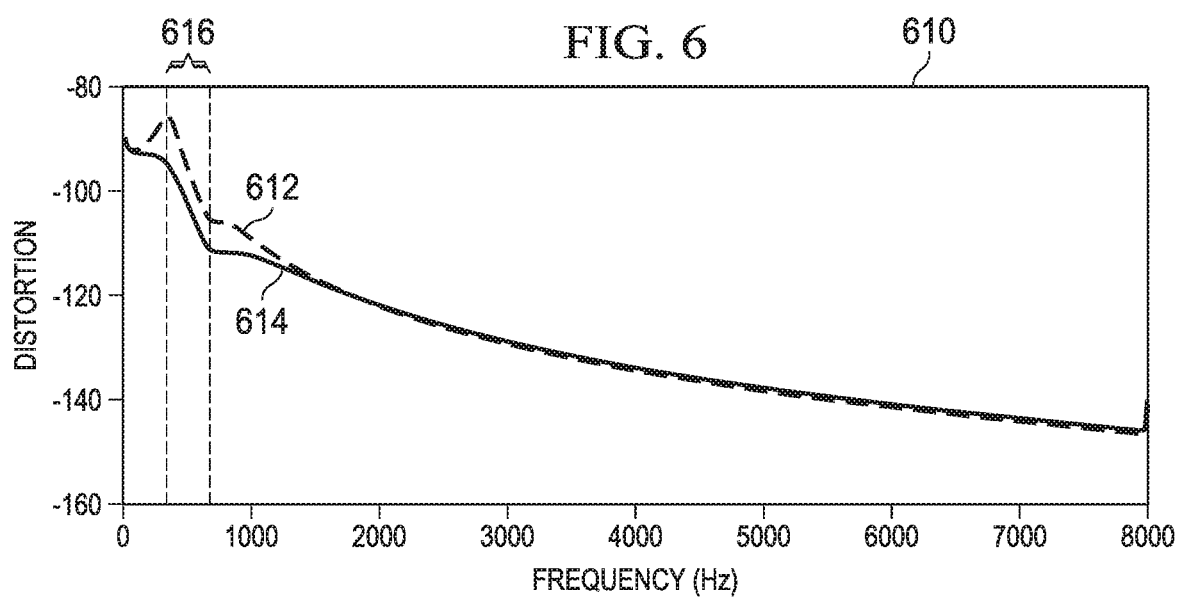

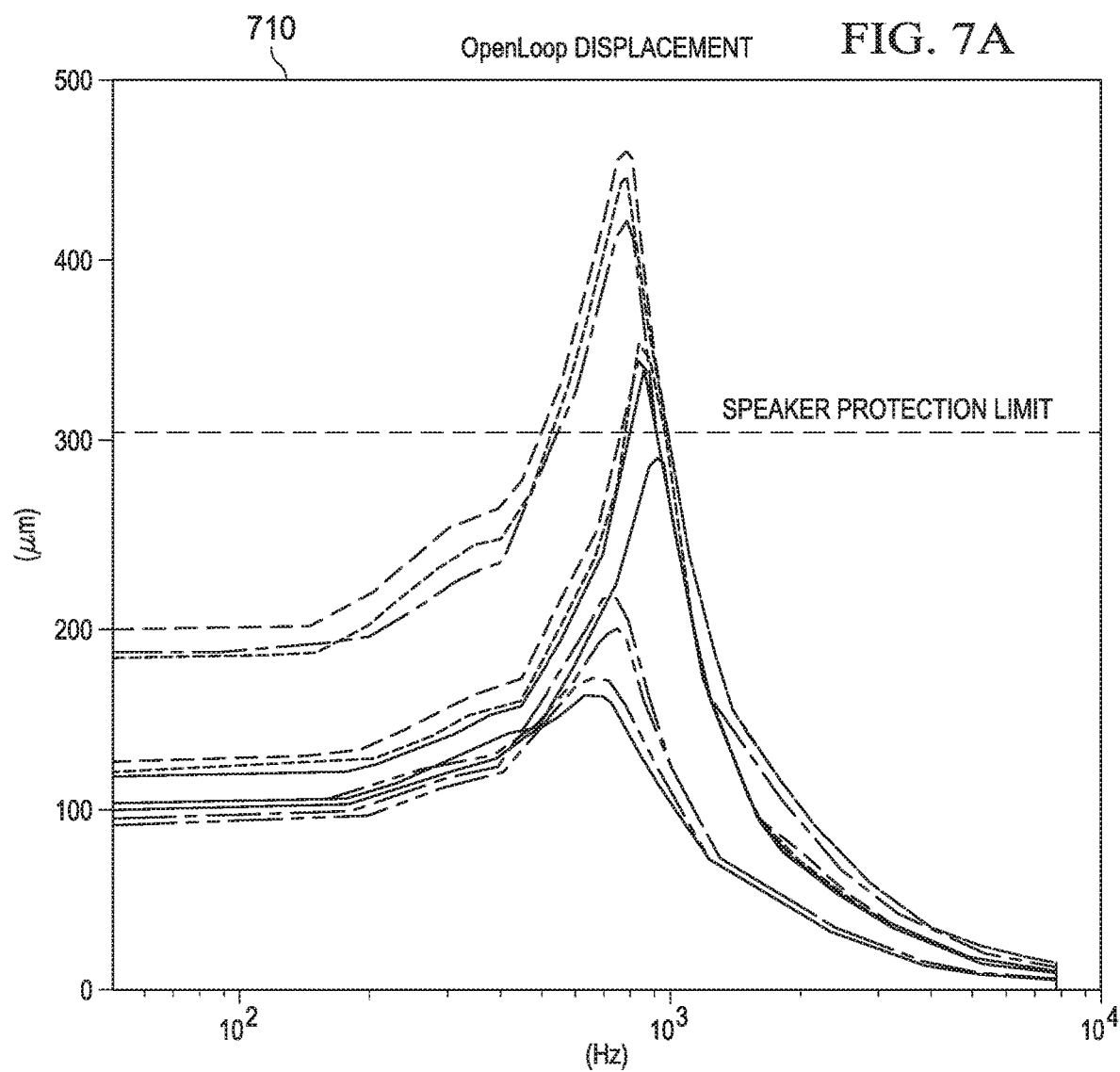

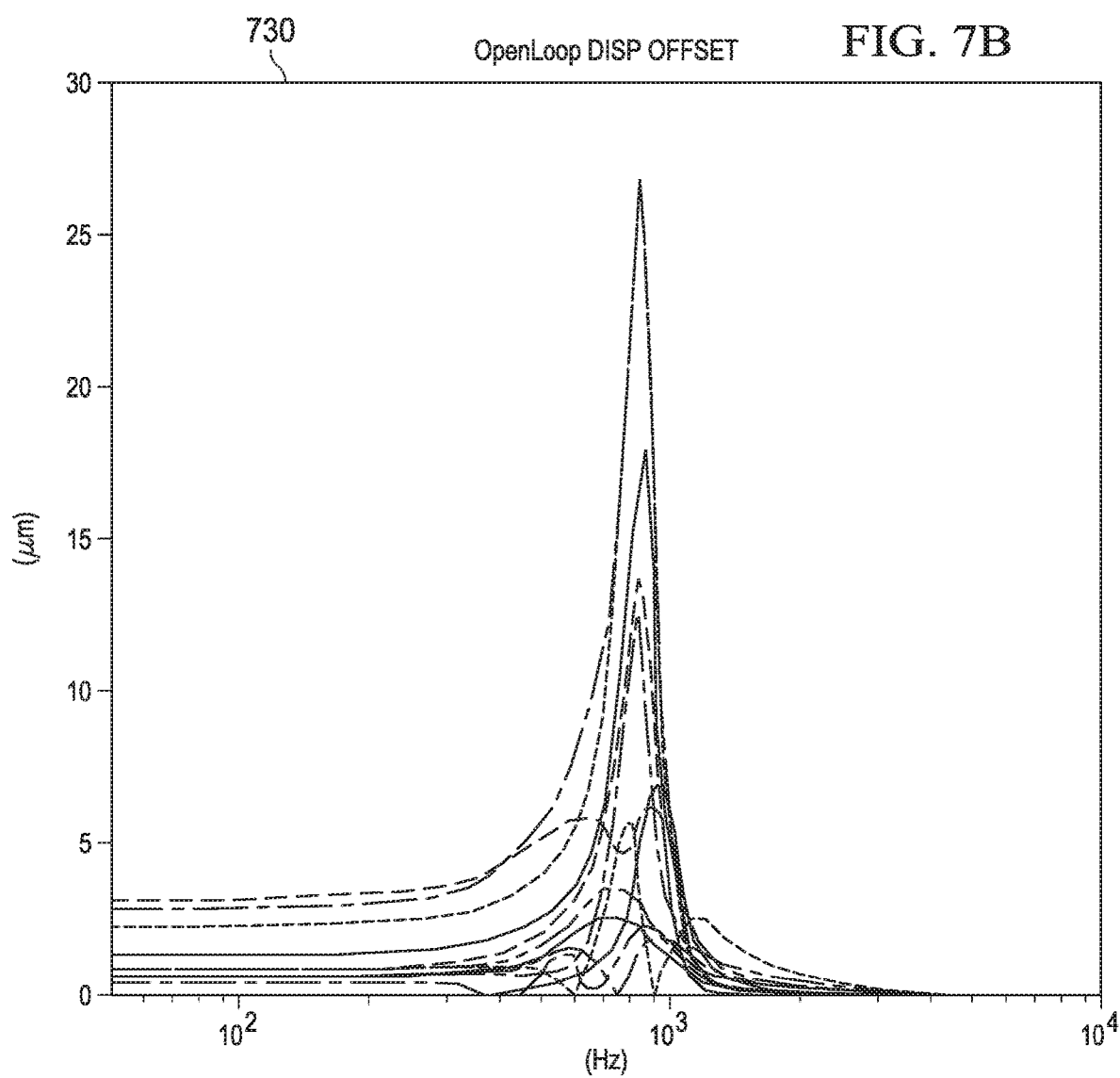

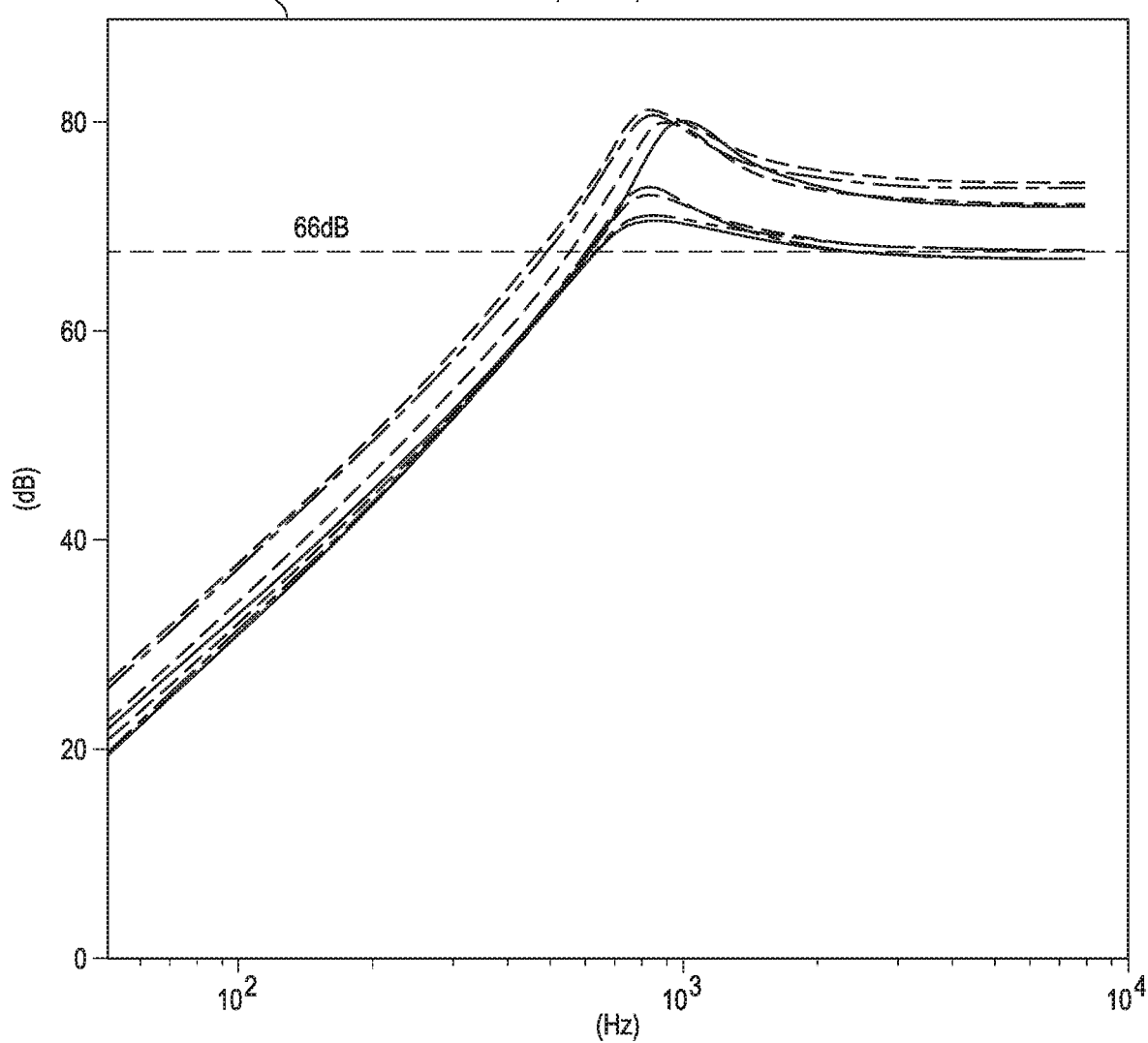

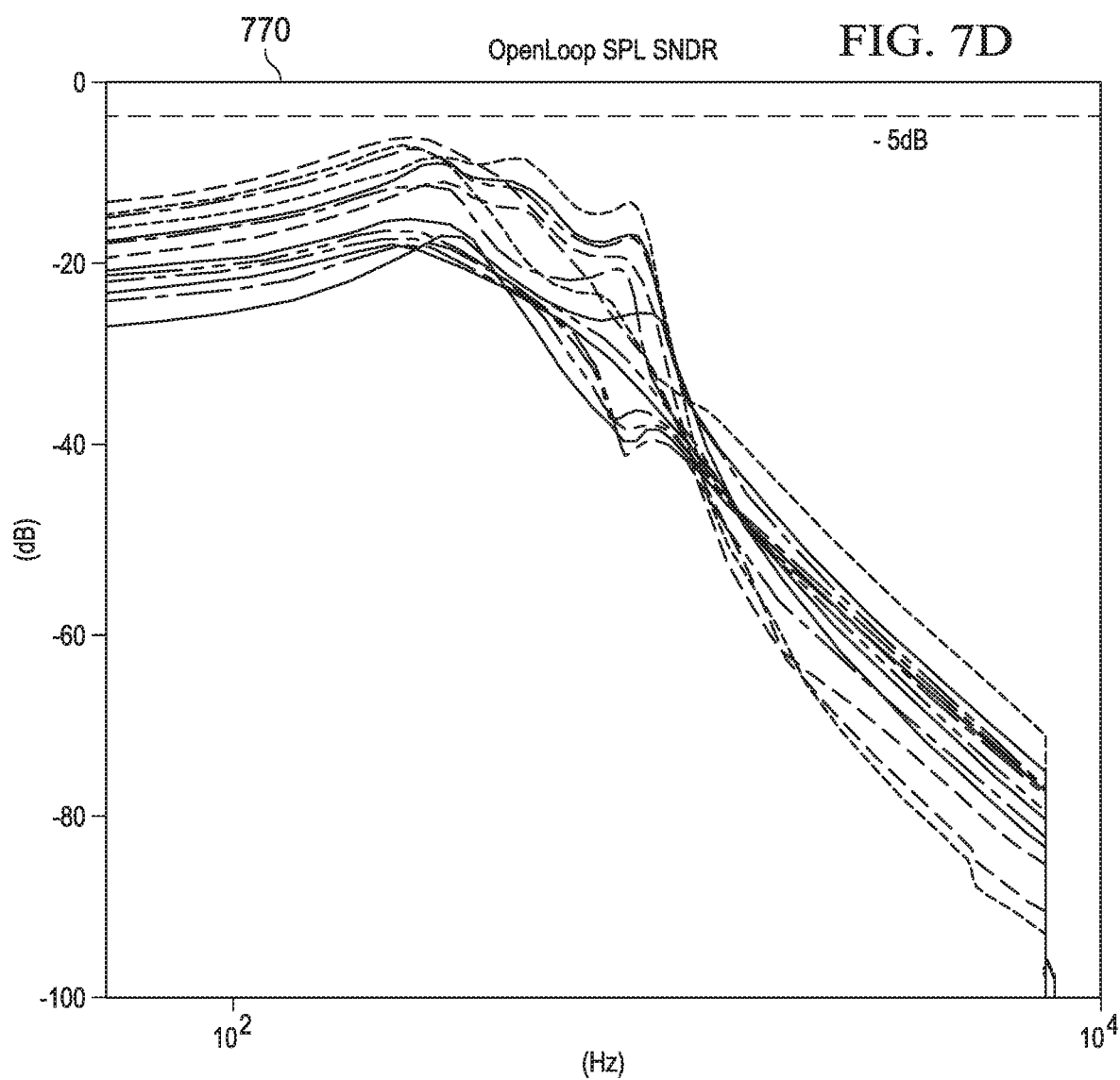

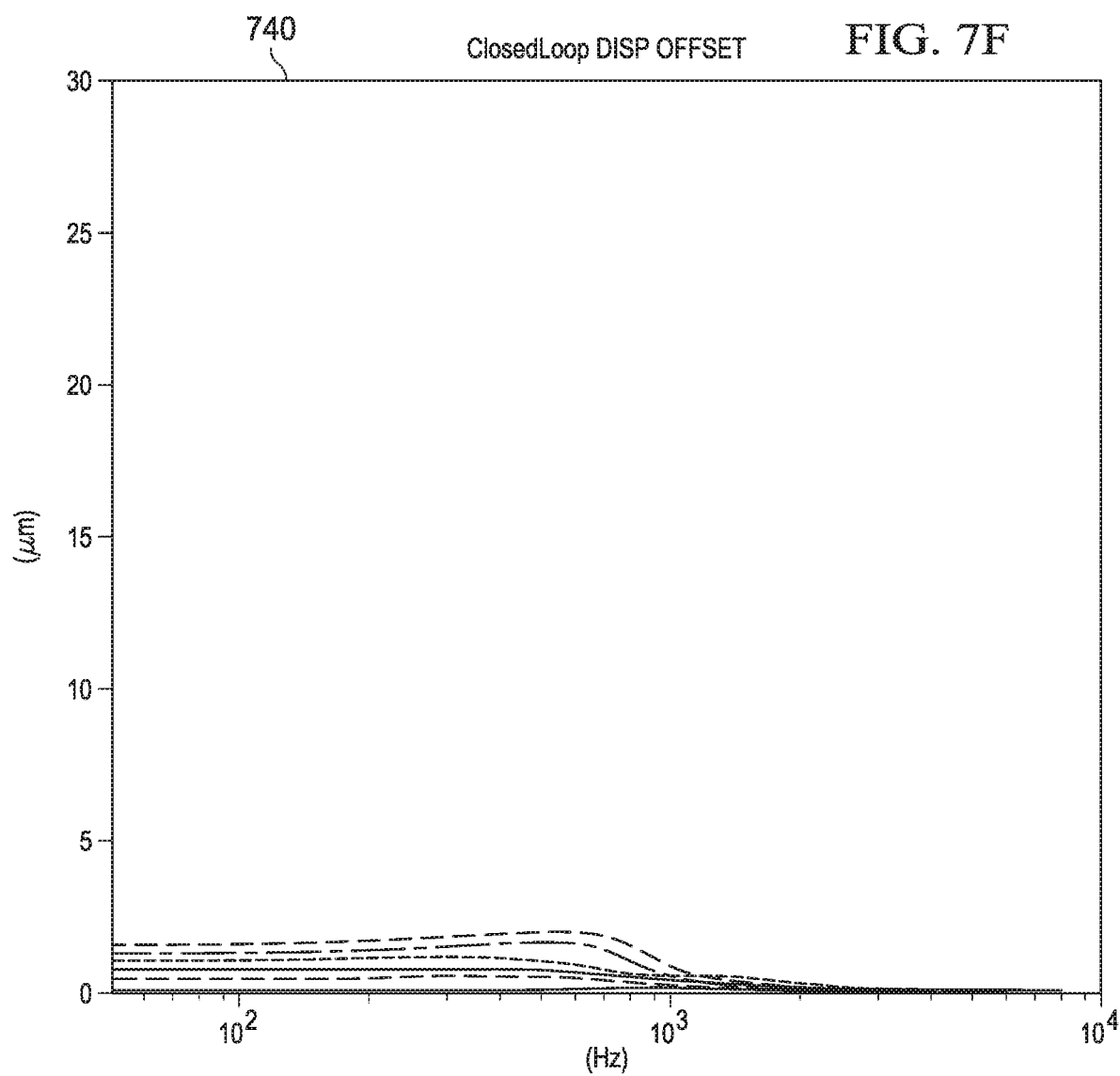

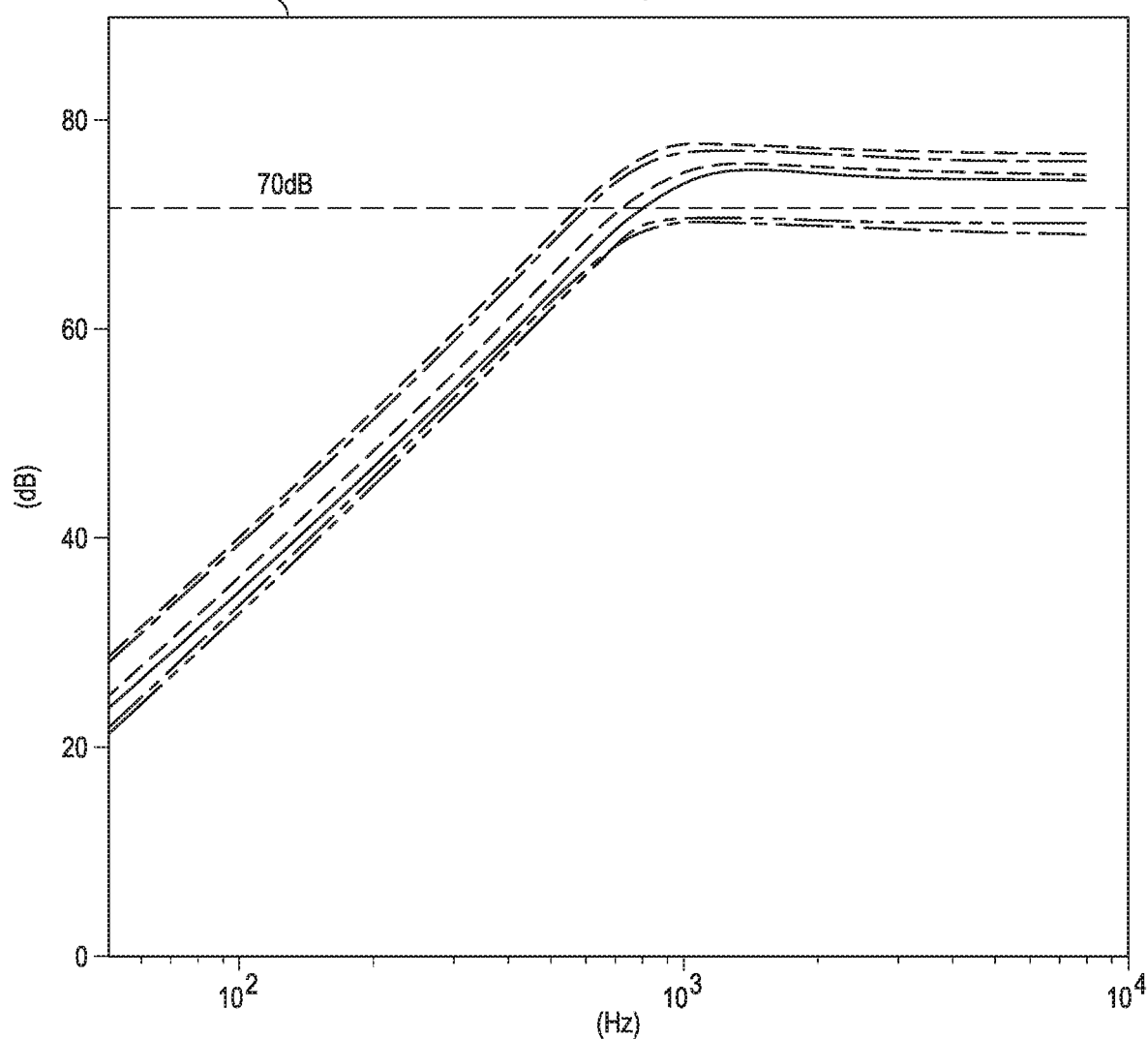

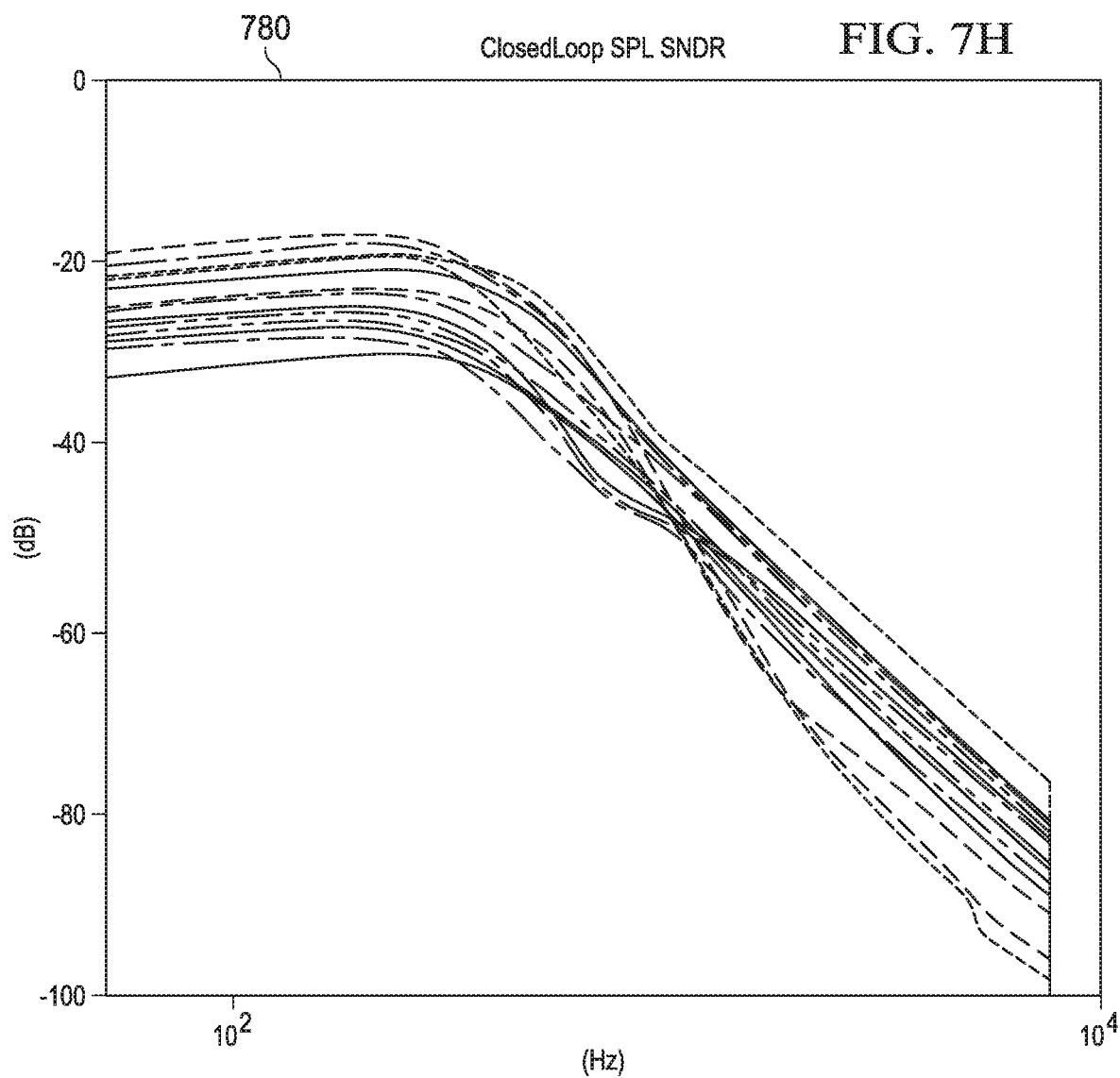

LOUDSPEAKER ENHANCEMENT

TECHNICAL FIELD

This application claims priority to U.S. patent application Ser. No. 15/584,532, filed May 2, 2017. The entire disclosure of Ser. No. 15/584,532 is hereby fully incorporated herein by reference.

BACKGROUND

A loudspeaker is an electroacoustic transducer that converts analog electrical audio signals into a corresponding sound. The loudspeaker can include a voice coil, a magnet, and a diaphragm. The audio signals are applied to the voice coil, which results in the diaphragm moving the cone back and forth at high speeds to create sound waves. These sound waves can be tuned to a resonance frequency to create more pleasant sounds for a user via use of high quality materials. For example, mounting the loudspeaker in a properly designed speaker enclosure tends to result in more pleasant sounds for a user. Moreover, a high quality diaphragm material may be chosen to maximize sound quality. The sound waves can also be tuned through use of an equalizer that adjusts frequency components within the audio signals to create more pleasant sounds for the user. Yet another technique to maximize sound quality is to inject pre-distortion into the audio signal to cancel out a portion of the audio signal that may produce distortion with the loudspeaker.

SUMMARY

One example includes a system that is comprised of a speaker, an amplifier, a current sensor, and a compensator circuit. The speaker produces audio in response to an amplified analog input signal received at a speaker input. The amplifier receives an analog audio input signal and provides the amplified analog audio input signal to the speaker input. The current sensor senses current passing through the speaker and provides a current sensor signal indicative thereof. The compensator circuit applies a transfer function to the current sensor signal to provide a compensation signal as feedback into the analog audio input signal, the transfer function matching at least one of resistance and inductance of the speaker.

Another example includes a method. The method includes producing, with a speaker, audio in response to an amplified analog input signal received at a speaker input. The method further includes amplifying an analog audio input signal to provide the amplified analog audio input signal to the speaker input. The method further includes sensing electrical current passing through the speaker and providing a current sensor signal indicative thereof. The method further includes applying a transfer function to the current sensor signal to provide a compensation signal that is injected as feedback into the analog audio input signal that is being amplified, the transfer function matching at least one of resistance and inductance of the speaker.

Another example includes another system that is comprised of a speaker, a scaler, an amplifier, a current sensor, and a compensator circuit. The speaker produces audio in response to a second amplified analog input signal received at a speaker input. The scaler attenuates an analog audio input signal and provides the attenuated analog audio input signal. The amplifier receives the attenuated analog audio input signal and provides the amplified analog audio input signal to the speaker input. The current sensor senses current passing through the speaker and provides a current sensor signal indicative thereof. The compensator circuit applies a transfer function to the current sensor signal to provide a compensation signal as feedback into the attenuated analog audio input signal, the transfer function matching at least one of resistance and inductance of the speaker.

BRIEF DESCRIPTION OF THE DRAWINGS

FIGS. 5A-5D illustrate example plots demonstrating performance of the speaker system with and without implementation of the compensator circuit.

FIG. 6 illustrates an example plot of distortion as a function of frequency for a speaker system.

FIGS. 7A-7H illustrate more example plots demonstrating performance of the speaker system with and without implementation of the compensator circuit.

DETAILED DESCRIPTION

This disclosure relates to an enhanced loudspeaker. Example embodiments include a system that includes a speaker, an amplifier, a current sensor, and a compensator circuit. The speaker produces audio in response to an amplified analog input signal received at a speaker input. The amplifier receives an analog audio input signal and provides the amplified analog audio input signal to the speaker input. The current sensor senses current through the speaker and provides a current sensor signal indicative thereof. The compensator circuit applies a transfer function to the current sensor signal to provide a compensation signal, which is fed (e.g., as feedback) into the analog audio input signal. The transfer function of the compensator circuit is configured to match resistance and/or inductance of the speaker. The compensator circuit can also apply a gain to adjust the amplitude of the compensation signal that is injected into the analog audio input signal. The combined signal thus is amplified by amplifier to drive the speaker.

Configuring a loudspeaker system in this manner helps to create a high quality sound with minimal additional expense, as compared to existing approaches that tends to utilize more expensive, high quality materials and a loudspeaker enclosure to produce comparable high quality sound. The example embodiments help increase sound volume while reducing extreme displacement of the diaphragm of the speaker, which may lead to damaging the speaker. The reduction in diaphragm movement mitigates damaging the diaphragm when the system, for example, is implemented as a micro-speaker, such as an ear-bud type speaker or mobile phone speaker. Moreover, the example embodiments disclosed herein provide a loudspeaker that produces low tonal distortion, for example in woofers and subwoofers, while producing an equal sound level over the speaker's useful frequency range. For instance, example embodiments provide for speaker equalization that adapts to different speaker types, adjusts to speaker variations, with greater than approximately 10 dB in speaker linearity, generates more sound for a given linearity, and improves speaker linearity up to a resonance frequency.

Figure 1:
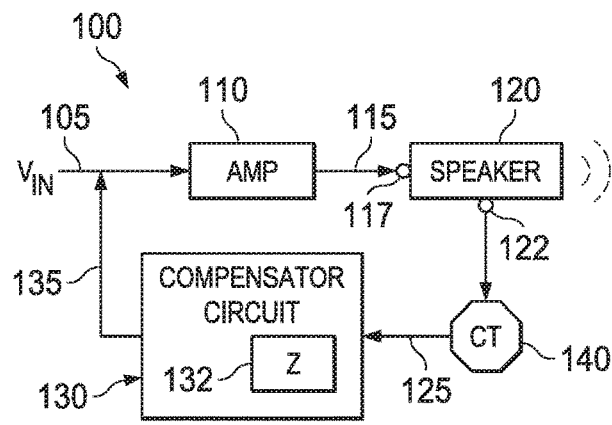
FIG. 1 illustrates an example speaker system that includes a compensator circuit.

FIG. 1 illustrates an example system (e.g., a loudspeaker system) 100 that includes a compensator circuit 130 to enhance audible sound produced by a speaker 120. The system 100 includes an amplifier 110 that receives an input 105 that includes both an analog audio input signal $V_{IN}$ and a compensation signal 135. For example, the audio input $V_{IN}$ and the compensation signal 135 may be provided via electrically conductive lines (e.g., wires or traces). The amplifier 110 amplifies this combination analog audio input signal $V_{IN}$ and compensation signal to produce an amplified version of the combined input signal at an output thereof (e.g., corresponding to a wire or trace) 115. In an example embodiment, the amplifier 110 is a linear class-D amplifier.

The system 100 further includes the speaker 120. For example, the speaker 120 includes a voice coil, a magnet, and a diaphragm. The speaker 120 includes a speaker input 117 to accept the amplified analog input signal produced by the amplifier 110 via output 115. The speaker 120 produces an audible sound in response to the receiving the amplified analog input signal. For example, the amplified analog input signal drives the voice coil which causes the diaphragm moving the associated cone back and forth to create sound waves that correspond to the audible sound. The speaker 120 has an impedance, which may include resistance and/or inductance. In some examples, the speaker 120 has an impedance of 4, 6 or 8 ohms.

The system 100 further includes a current sensor 140 to sense electrical current through the speaker 120. The current sensor 140 is coupled in series with the speaker 120, such as connected to a speaker output 122 of the speaker 120. The current sensor 140 is connected to provide an indication of the sensed speaker current to the compensator circuit 130. The current sensor 140 senses an amount of current passing through the speaker 120 and produces a current sensor signal 125 that is provided to the compensator circuit 130. In an example, the current sensor 140 may be a shunt resistor based current sensor, a flux gate current sensor, or any other type of current sensor that enables sensing an amount of current passing through the speaker 120.

The compensator circuit 130 enhances the audible sound produced by the speaker 120. In the example of FIG. 1, the compensator circuit 130 is coupled between the speaker output 122 and the amplifier input 105. In an example embodiment, the compensator circuit 130 incorporates the current sensor 140 into a single circuit. The compensator circuit 130 produces a compensation signal 135 in response to the current sensor signal 125 received from the current sensor 140 and based on a transfer function 132 of the compensator circuit 130. For example, the compensation circuit 130 applies the transfer function 132 to the current sensor signal 125 to produce the compensation signal 135 that is injected into the audio input provided to the amplifier 110. The transfer function 132 thus can be configured to provide feedback based on the impedance Z of the speaker 120 and a predetermined gain factor (e.g., less than unity gain). For example, the transfer function 132 of the speaker can be configured to implement inductive compensation, resistive compensation or a combination of inductive and resistive compensation based on the impedance characteristics of the speaker 120 in the system 100. Additionally, the compensator circuit can apply the gain factor corresponding to a coefficient of amplification a, such as disclosed herein.

The compensator circuit 130 outputs the compensation signal 135, where the compensation signal is injected as feedback into the analog audio input signal $V_{IN}$ on the signal input 105. This compensation signal 135 enables the speaker 120 to produce a higher volume of audible sound with the loudspeaker 120 without an increase in the sound volume associated with the analog audio input signal $V_{IN}$. Because the sound volume of the analog audio input signal $V_{IN}$ is not being increased for a given increase in volume resulting from the closed loop system afforded by the compensator circuit 130, the compensation signal mitigates extreme displacement of a diaphragm of the speaker 120, which prevents damage to the diaphragm, for example when implemented with a micro-speaker. Moreover, the compensation signal mitigates low tonal distortion in the audible sound produced by the speaker 120, for example when implemented at lower frequency range, such as a woofer or subwoofer. The compensator circuit 130 enables the speaker 120 to produce higher quality audio, allowing a less expensive speaker to produce a high quality sound. Such high quality sound also allows use of a less expense speaker enclosure while still being able to produce a high quality sound. Thus, the compensator circuit 130 affords for reduced diaphragm displacement and displacement offset that provides additional head-room for speaker protection and loudness.

Figure 2:
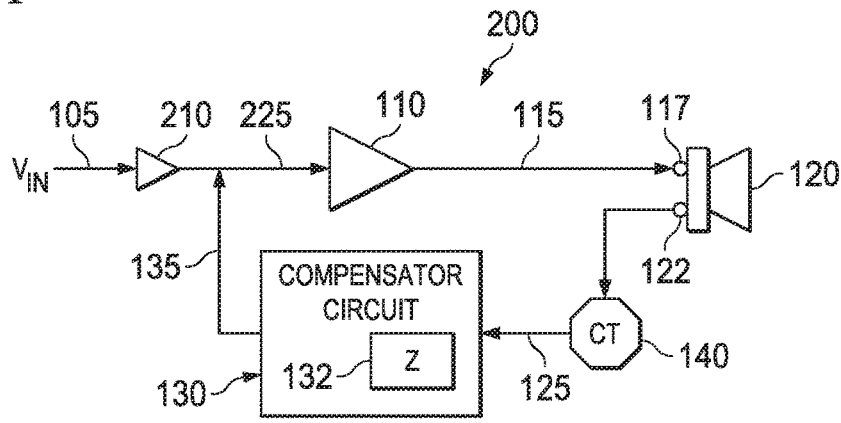
FIG. 2 illustrates another example system that includes the compensator circuit.

FIG. 2 illustrates an example of another example system 200 that includes a compensator circuit 130 to enhance an audible sound produced by the speaker 120. The system 200 may further include a scaler 210 that attenuates the analog audio input signal $V_{IN}$ on input 105. The attenuated input signal produced by the scaler 210 is provided to the amplifier 110 via signal input (e.g., a trace or wire) 225.

In the embodiment of FIG. 2, the compensator circuit 130 injects the compensation signal 235 into the attenuated analog audio input signal 225 produced by the scaler 210 to drive the amplifier 110. Thereafter, the amplifier 110 receives a combination input signal corresponding to the attenuated analog audio input signal produced by scaler 210 and the compensation signal produced by the compensator circuit 130. The amplifier 110 amplifies this combination attenuated analog audio input signal produced by scaler 210 and the compensation signal by an amplitude amount A and outputs an amplified version of this combination signal that is provided to the input 117 of the speaker 120.

Figure 3:
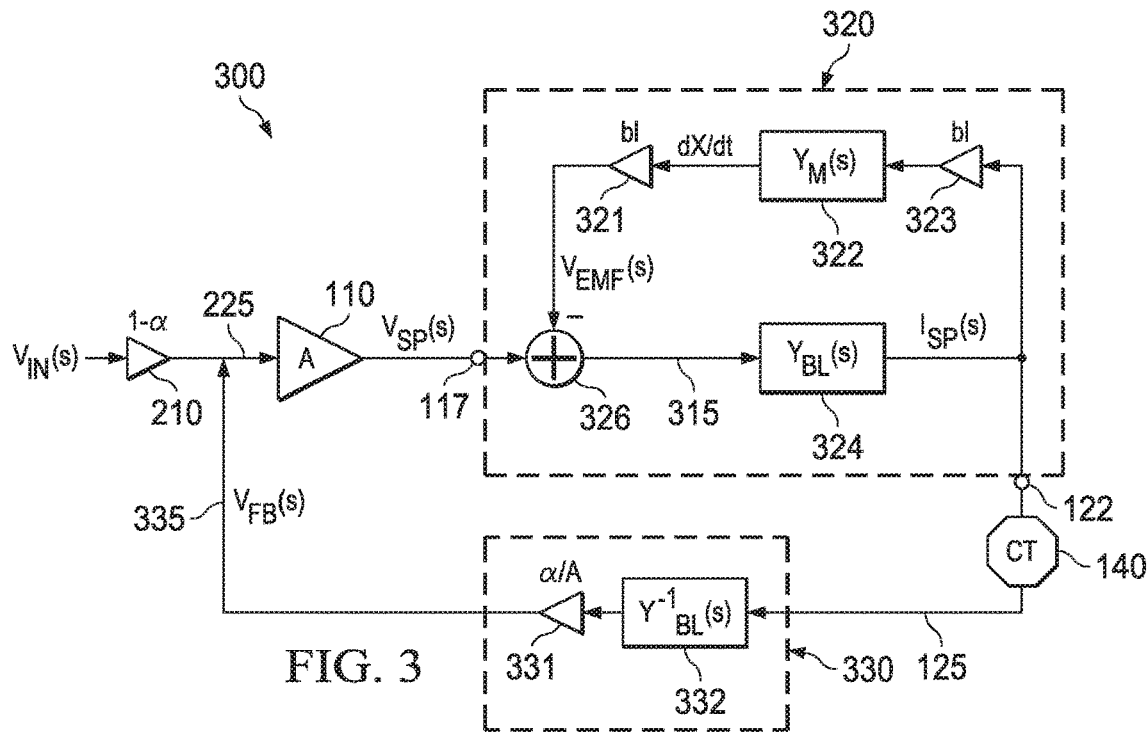
FIG. 3 illustrates an example circuit diagram demonstrating a speaker system that includes a compensator.

FIG. 3 illustrates an example demonstrating a functional circuit model representation of a loudspeaker system, such as corresponding to the system 200 of FIG. 2. In this example, the scaler 210 attenuates a $V_{IN}(s)$ signal, whose voltage is a function of the analog audio input signal, by an amount 1-α, where α is a gain coefficient for amplification. In an example, a ranges from approximately 0.7 to 0.8 for speakers with a resonant frequency in a range from approximately 500 Hz to approximately 1 kHz to produce a maximally flat critically damped frequency response. The coefficient a can be computed for other speakers to provide a critically damped sound pressure level (SPL). The amplifier 110 receives both the attenuated analog audio input signal produced by scaler 210 and the compensation signal produced by the compensator circuit 330, on input 225. The amplifier 110 amplifies this combination attenuated analog audio input signal produced by scaler 210 and the compensation signal by an amplitude amount A and outputs an amplified version of this combination signal on output 115, and produces a signal $V_{SP}(s)$. The flat SPL frequency response dampens harmonic power generated by nonlinear speaker mechanics.

As an example, a sound pressure level SPL may be approximated in the frequency domain (as a function of s) for the speaker 320 as follows:

$$SPL(s) \approx \frac{A(1-\alpha)s^2}{\substack{s^3(1-\alpha)L_E M + \\ s^2(1-\alpha)(R_E M + L_E B) + \\ s((1-\alpha)R_E B + bl^2) + (1-\alpha)R_E K}} V_{IN}(s) \quad \text{Equations 1}$$

where A is the amplification provided by the amplifier 110,
α is a coefficient of amplification,
M is a measured mass that is applied to the diaphragm of the speaker 320,
B is a flux density in a voice coil air gap of the speaker 320,
K is a spring action of a cone suspension, e.g., K=K·(1+ $k_1 x + k_2 x^2 + k_3 x^3 + \ldots$ )
$R_E$ is an equivalent resistance of the speaker 320,
$L_E$ is an equivalent inductance of the speaker 320,
bl is a measurement of a motor strength of the speaker 320, e.g., $$bl = bl \cdot (1 + b_1 x + b_2 x^2 + b_3 x^3 + \ldots), \text{ and}$$

$V_{IN}(s)$ is a voltage of the analog input signal as a function of s.

The speaker 320 may be represented as including an admittance transfer function 324 that receives both the $V_{SP}(s)$ voltage produced by the amplifier 110 and the $V_{EMF}(s)$ produced by amplifier 321, on input 315. The admittance transfer function 324 transforms this combination signal in accordance with the equation:

$$Y_{BL}(s) = \frac{1}{R_E + sL_E} \quad \text{Equation 2}$$

The admittance transfer function 324 produces a speaker current $I_{SP}(s)$ in accordance with the equation:

$$I_{SP}(s) = \frac{A(1-\alpha)(Ms^2 + Bs + K)}{\substack{s^3(1-\alpha)L_E M + \\ s^2(1-\alpha)(R_E M + L_E B) + \\ s((1-\alpha)R_E B + bl^2) + (1-\alpha)R_E K}} V_{IN}(s) \quad \text{Equation 3}$$

The speaker 320 may be represented as further including an amplifier 323 that accepts the current $I_{SP}(s)$ produced by the admittance transfer function 324 and amplifies this current by the amount bl, where bl is a measurement of a motor strength of the speaker 320, e.g., expressed in Tesla meters. Thus bl is a function of the strength of a transducer of the speaker 320, such as corresponding to how well the speaker moves the cone for a given input signal. For example, a measured mass is applied to the diaphragm of the speaker 320, forcing the diaphragm back while the current required for the motor to force the mass back is measured as a bl value. A high bl value provides an indication of a strong transducer that moves the diaphragm with authority. As a result of the compensator circuit 330 providing feedback that includes coefficient of amplification α, as demonstrated in FIG. 3, a new bl for the speaker system 300 is provided in accordance with the equation:

$$bl_{new} = \frac{bl}{\sqrt{1-\alpha}} \quad \text{Equation 4}$$

By setting α to less than 1 (e.g., from about 0.7 to about 0.8), for example, $bl_{new}$ is approximately twice as strong for a given loudspeaker system 300 as compared to a system that does not implement the closed loop feedback provided by compensator circuit 130/330/430.

The amplifier 323 produces an amplified signal that is provided to another signal transformer 322. The signal transformer 322 transforms the amplified signal from the amplifier 323 in accordance with the equation:

$$Y_M(s) = \frac{s}{Ms^2 + Bs + K} \quad \text{Equation 5}$$

The signal transformer 322 produces an ouput signal according to a time domain derivative function dX/dt. The amplifier 321 produces a signal $V_{EMF}(s)$, a voltage that is a function of electromotive force of the voltage of the signal $V_{IN}(s)$ applied to the system 300. The signal $V_{EMF}(s)$ produced by amplifier 321 is combined with the signal $V_{SP}(s)$ produced by amplifier 110 via summing node 326 to provide a combined signal to the admittance transfer function 324.

The compensator circuit 330 may be represented as including an inverse admittance transfer function (e.g., an impedance based transfer function) 332. The transfer function 332, for example, transforms the current sensor signal produced by the current sensor 140 in accordance with both the resistance of the speaker 320. As shown in the example of FIG. 3, the transfer function 332 transforms the current sensor signal produced by the current sensor 140 in accordance with the equation:

$Y^{-1}_{BL}(s)$ Equation 6, which is an inverse of Equation 2.

The compensator circuit 330 may be represented as also including a gain stage 331. The gain stage 331 is coupled to an output of the transfer function 332 and amplifies the signal produced by the transfer function 332 by an amount of gain, demonstrated as α/A, to dampen the output of the transfer function 332. The gain stage 331 produces a compensator signal $V_{FB}(s)$ that is output on signal wire 335, the signal $V_{FB}(s)$ being combined with the attenuated $V_{IN}(s)$ produced by scaler 210 on input 225.

Figure 4:
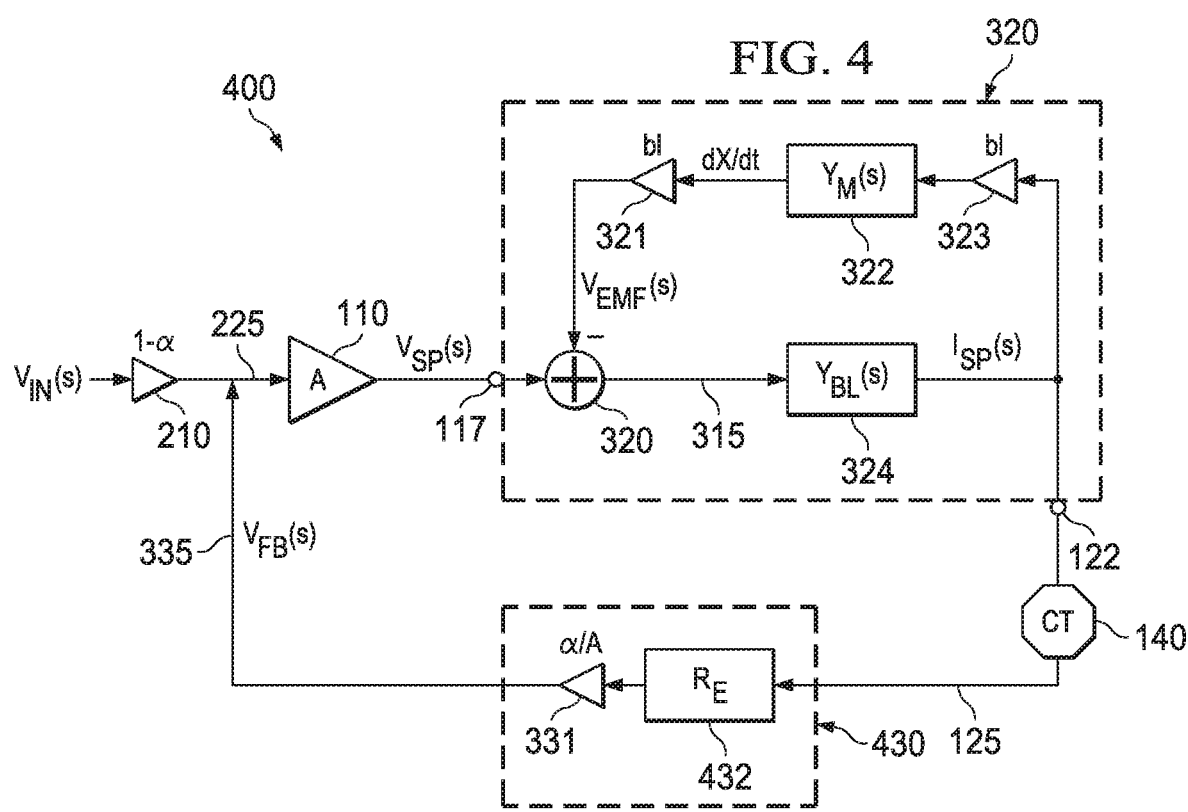
FIG. 4 illustrates an example circuit diagram demonstrating another system that includes a compensator circuit.

FIG. 4 illustrates an example of a system 400 that includes another example of a compensator circuit 430. In this example, the compensator circuit 430 that is configured to provide a resistive transfer function, matching a resistance of the speaker 320. That is, in the example of FIG. 4 the transfer function is purely resistive. The compensator circuit 430 provides equalization of the $V_{IN}(s)$ signal and provides linearization that is approximately equal to the inductive compensator circuit 330 of FIG. 3, further improving on equalization that is available through typical digital equalization methods. Implementing the compensator circuit 430 with the equivalent resistance $R_E$ 432 (e.g., with a resistor), without compensating for the inductance of the speaker 320, reduces cost and space requirements associated with implementing an inductor in the compensator circuit 330, while providing comparable performance to the compensator circuit 330. In another example, the compensator circuit 430 is implemented with an equivalent inductance $L_E$ (e.g., with an inductor) in combination with the equivalent resistance $R_E$ 432 (e.g., with a resistor).

FIGS. 5A-5D illustrate example plots demonstrating performance of the speaker system (e.g., speaker system 100/200/300/400) with and without implementation of the compensator circuit 130/330/430. In the examples of FIGS. 5A-5D, each of the graphs demonstrate different compensation feedback, namely with a substantially optimized α and with α=0. As used herein, the term "substantially" as a modifier is intended to convey that, while a particular term being modified is intended, some amount of variation (e.g., about ±5%) may exist from the intended parameter, such as due to process variations and/or manufacturing tolerances.

Figure 5A:
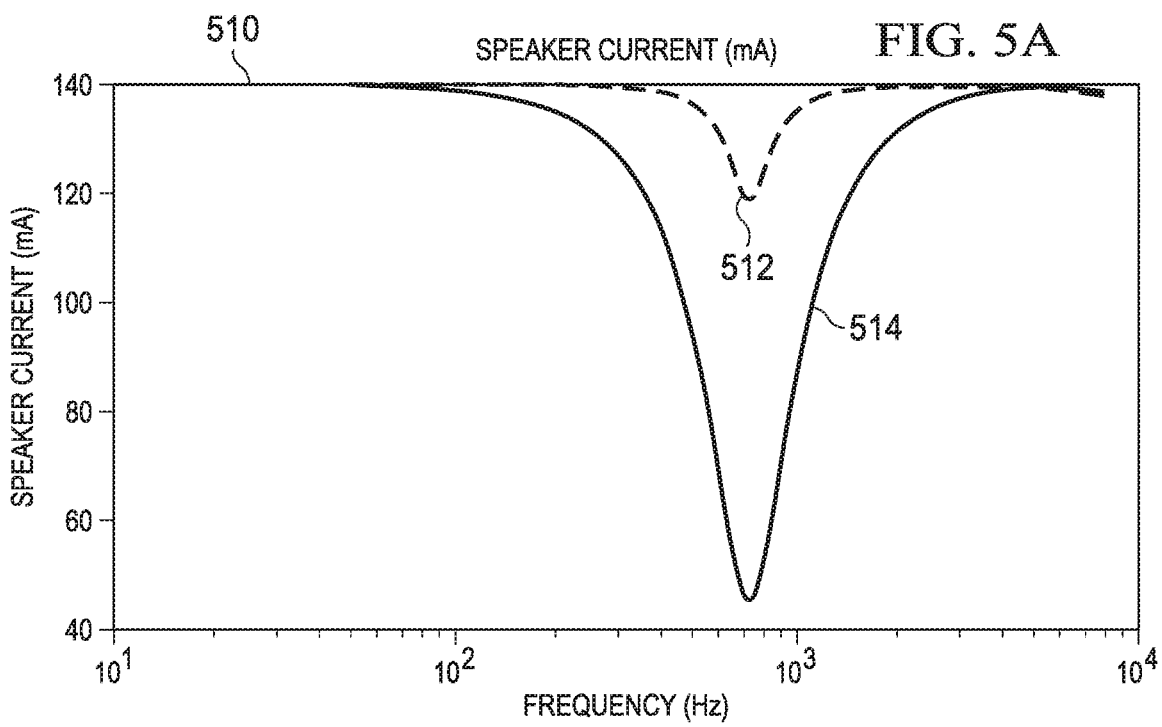

FIG. 5A illustrates an example speaker current plot 510 that includes curves 512 and 514, with curve 512 representing speaker system 100/200/300/400 performance without implementing the compensator circuit 130/330/430 (e.g., α=0) and curve 514 representing speaker system 100/200/300/400 performance while implementing the compensator circuit 130/330/430 (e.g., a substantially optimized α). Curves 512 and 514 illustrate the amount of current used to produce various frequencies produced with the speaker system 100/200/300/400. Curve 512 spans a frequency range between approximately 30-18,000 Hz, centered approximately at 1650 Hz, and spans a current range between approximately 118-140 mA. Curve 514 spans a frequency range between approximately 30-18,000 Hz, centered approximately at 1650 Hz, and spans a current range between approximately 45-140 mA. Thus, for the example frequency of 1650 Hz, the speaker system 100/200/300/400 would require approximately 73 mA less current to produce the same displacement/SPL while implementing the compensator circuit 130/430.

Figure 5B:
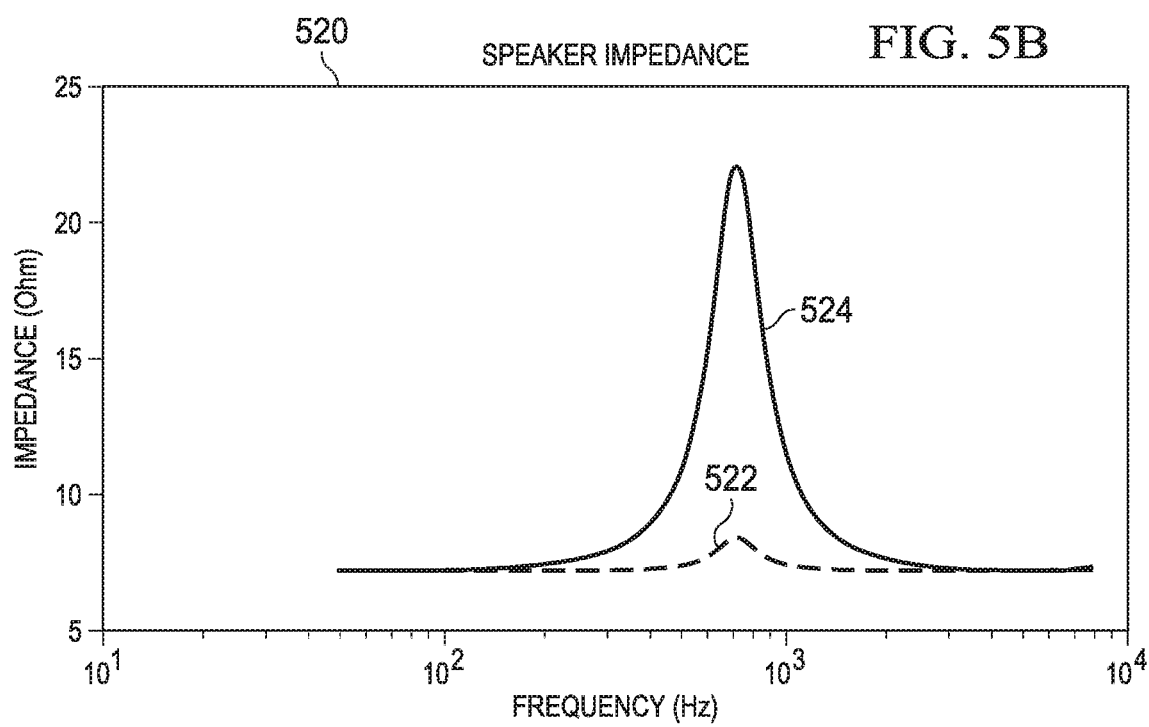

FIG. 5B illustrates an example speaker impedance plot 520 that includes curves 522 and 524, with curve 522 representing speaker system 100/200/300/400 performance without implementing the compensator circuit 130/430 and curve 524 representing speaker system 100/200/300/400 performance while implementing the compensator circuit 130/430. Curves 522 and 524 illustrate the amount of speaker impedance at various frequencies produced with the speaker system 100/200/300/400. Curve 522 spans a frequency range between approximately 50-18,000 Hz, centered approximately at 1650 Hz, and spans an impedance range between approximately 7-8 Ohms. Curve 524 spans a frequency range between approximately 30-18,000 Hz, centered approximately at 1650 Hz, and spans an impedance range between approximately 7-22 ohms. Thus, for the example frequency of 1650 Hz, the speaker system 100/200/300/400 impendence is increased by approximately 14 ohms while implementing the compensator circuit 130/430.

Figure 5C:
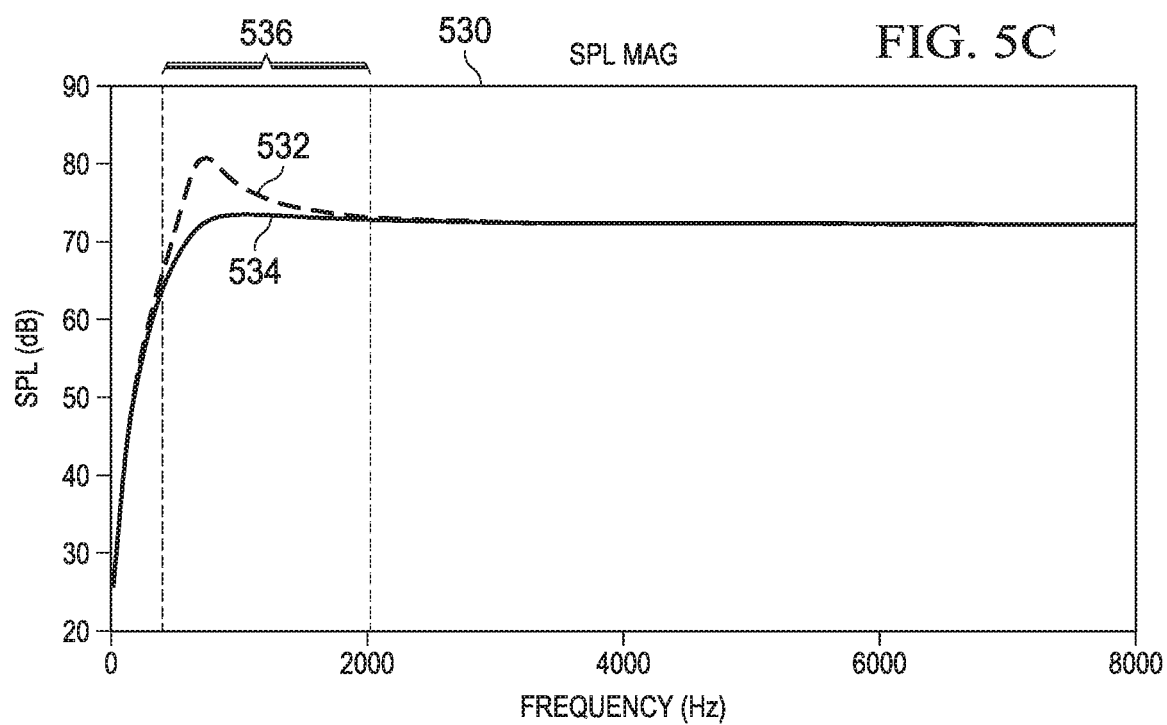

FIG. 5C illustrates an example speaker sound pressure level in decibel (dB) magnitude plot 530 that includes curves 532 and 534, with curve 532 representing speaker system 100/200/300/400 performance without implementing the compensator circuit 130/430 and curve 534 representing speaker system 100/200/300/400 performance while implementing the compensator circuit 130/430. Curves 532 and 534 illustrate a number of dBs produced at various frequencies by the speaker system 100/200/300/400. Curve 532 spans a frequency range between approximately 0-8,000 Hz and spans a dB range from approximately 0-82 dB, reaching a peak 82 dB at approximately 570 Hz. Curve 534 spans a frequency range between approximately 0-8,000 Hz and spans a dB range from approximately 0-73 dB, reaching a peak 73 dB at approximately 700 Hz. Moreover, curve 534 remains approximately flat after reaching its peak in contrast to curve 532 that reaches a peak at 82 dB and flattens out for frequencies greater than approximately 2000 Hz. Thus, sound pressure levels for a speaker system 100/200/300/400 are lower in a region 536 between approximately 400-2000 Hz while implementing the compensator circuit 130/330/430.

FIG. 5D illustrates an example speaker sound pressure level in phase plot 540 that includes curves 542 and 544, with curve 542 representing speaker system 100/200/300/400 performance without implementing the compensator circuit 130/430 and curve 544 representing speaker system 100/200/300/400 performance while implementing the compensator circuit 130/430. Curves 542 and 544 illustrate a phase of sound pressure levels at various frequencies produced with the speaker system 100/200/300/400. Curve 542 spans a frequency range between approximately 0-8,000 Hz and spans a SPL phase range from approximately −10 to 175 degrees. Curve 544 spans a frequency range between approximately 0-8,000 Hz and spans a SPL phase range from approximately −12 to 180 degrees. Curves 542 and 544 are in phase and approximately equal at 0, 800, and 8000 Hz, with curve 544 having a smaller phase between 0-800 Hz and a greater phase between 800-8000 Hz. Thus, for the greater part of the frequency range between 800-8000 Hz the phase is greater while implementing the compensator circuit 130/330/430. The phase linearity in the bass frequencies is superior while implementing the compensator circuit 130/330/430, as compared to these frequencies without compensation.

FIG. 6 illustrates an example distortion plot 610 for the speaker system 100/200/300/400, with curve 612 representing speaker system 100/200/300/400 performance without implementing the compensator circuit 130/430 and curve 614 representing speaker system 100/200/300/400 performance while implementing the compensator circuit 130/430. Curves 612 and 614 illustrate distortion at various frequencies produced with the speaker system 100/200/300/400. Curve 612 spans a frequency range between approximately 0-8,000 Hz and spans a distortion range from approximately −90 to −147. Curve 614 spans a frequency range between approximately 0-8,000 Hz and spans a distortion range from approximately −90 to −147 degrees. Curves 612 and 614 overlap between 0-100 Hz and between 1600-8000 Hz. However, particularly in region 616 between frequencies 375-750 Hz, the distortion of curve 612 is approximately 8 less than curve 614. Thus, for the frequency region 616 the distortion is lower while implementing the compensator circuit 120/320.

Figure 7E:
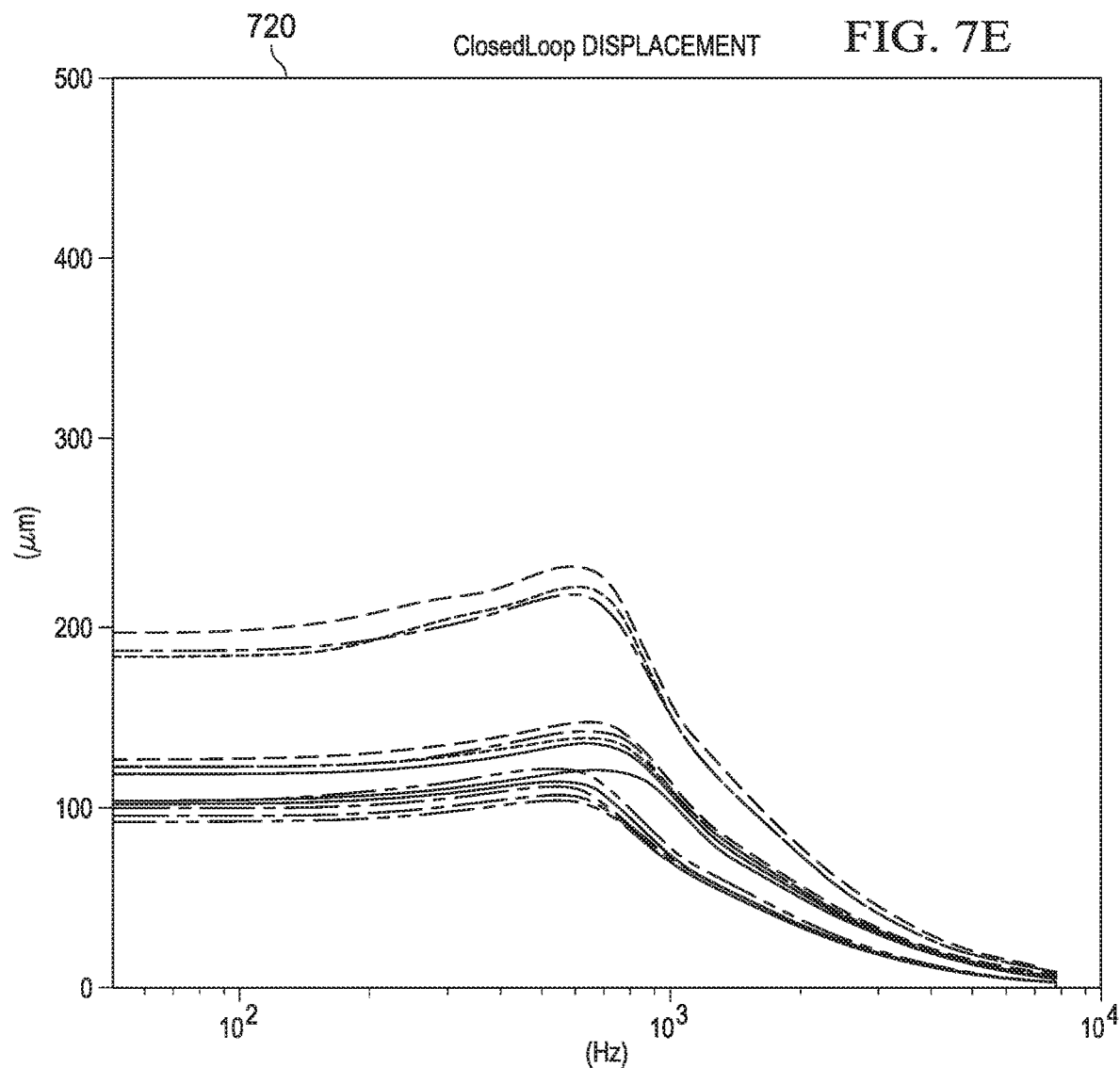

FIGS. 7A-7H illustrate more example plots demonstrating performance of the speaker system 100/200/300/400 with and without implementation of the compensator circuit 130/330/430. In the examples of FIGS. 7A-5H, each of the graphs demonstrate different compensation feedback, namely with a substantially optimized α and with α=0. The examples illustrated in FIGS. 7A-7H illustrate that implementation of the compensator circuit 130/330/430 allows a volume of $V_{IN}$ to be doubled without endangering the speaker 120/320. The examples illustrated in FIGS. 7A-7H illustrate that implementation of the compensator circuit 130/330/430 also improves linearity of speaker system 100/200/300/400, with the speaker system 100/200/300/400 producing clearer sound.

FIG. 7A illustrates an example plot 710 of displacement of a cone of the speaker 120/320 without implementation of the compensation circuit 130/330/430 (e.g., α=0). The various displacement curves illustrated in FIG. 7A span a frequency range between approximately 0-10 kHz, and span a cone displacement range between approximately 0-475 μm, peaking at approximately 800 Hz. As illustrated, a speaker protection limit of 300 μm had been crossed by the majority of the displacement curves shown, which may result in displacement damage to the speaker 120/320.

In contrast to the FIG. 7A, FIG. 7E illustrates an example plot 720 of displacement of a cone of the speaker 120/320 with implementation of the compensation circuit 130/330/430. The various displacement curves illustrated in FIG. 7E span a frequency range between approximately 0-10 kHz, and span a cone displacement range between approximately 0-225 μm, peaking at approximately 800 Hz. As illustrated, all of the displacement curves remain under the speaker protection limit of 300 μm, which result in more headroom for displacement protection for the speaker 120/320 or a greater volume for $V_{IN}$.

FIG. 7B illustrates an example plot 730 of displacement offset of a cone of the speaker 120/320 without implementation of the compensation circuit 130/330/430 (e.g., α=0). The various displacement offset curves illustrated in FIG. 7B span a frequency range between approximately 0-10 kHz, and span a cone displacement offset range between approximately 0-27 μm, peaking at approximately 800 Hz.

In contrast to the FIG. 7B, FIG. 7F illustrates an example plot 740 of displacement offset of a cone of the speaker 120/320 with implementation of the compensation circuit 130/330/430. The various displacement offset curves illustrated in FIG. 7F span a frequency range between approximately 0-10 kHz, and span a cone displacement offset range between approximately 0-2 μm, peaking at approximately 800 Hz. The near zero displacement offset results in more headroom for displacement offset protection for the speaker 120/320 or a greater volume for $V_{IN}$.

FIG. 7C illustrates an example plot 750 of SPL produced by the speaker system 100/200/300/400 without implementation of the compensation circuit 130/330/430 (e.g., α=0). The various SPL curves illustrated in FIG. 7C span a frequency range between approximately 0-10 kHz, and span an SPL range between approximately 20-85 dB, peaking at approximately 800 Hz. An SPL within a flat region of the curves occurs at 66 dB.

In contrast to the FIG. 7C, FIG. 7G illustrates an example plot 760 of SPL produced by the speaker system 100/200/300/400 with implementation of the compensation circuit 130/330/430. The various SPL curves illustrated in FIG. 7G span a frequency range between approximately 0-10 kHz, and span an SPL range between approximately 20-78 dB, peaking at approximately 800 Hz. An SPL within a flat region of the curves occurs at 70 dB. Thus, the SPL produced by the speaker system 100/200/300/400 with implementation of the compensation circuit 130/330/430 has a flatter frequency response. Moreover, the SPL produced by the speaker system 100/200/300/400 with implementation of the compensation circuit 130/330/430 allows the speaker system 100/200/300/400 to produce a higher volume at high frequencies.

FIG. 7D illustrates an example plot 770 of SPL Signal-to-Noise Ratio (SNDR) produced by the speaker system 100/200/300/400 without implementation of the compensation circuit 130/330/430 (e.g., α=0). The various SPL SNDR curves illustrated in FIG. 7D span a frequency range between approximately 0-10 kHz, and span an SPL SNDR range between approximately −5 to −95 dB, with the SPL SNDR curves peaking at approximately 500 Hz at −5 dB.

In contrast to the FIG. 7D, FIG. 7H illustrates an example plot 780 of SPL SNDR produced by the speaker system 100/200/300/400 with implementation of the compensation circuit 130/330/430. The various curves illustrated in FIG. 7H span a frequency range between approximately 0-10 kHz, and span an SPL SNDR range between approximately −20 to −100 dB, with an SPL SNDR peaking at approximately 500 Hz at −16 dB. Thus, the SPL SNDR produced by the speaker system 100/200/300/400 with implementation of the compensation circuit 130/330/430 improves signal to distortion by greater than 10 dB at a base range.

Figure 8:
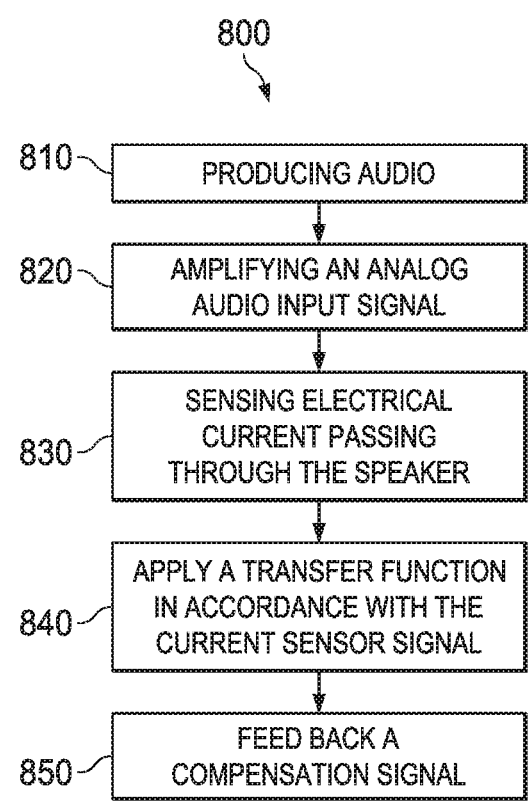
FIG. 8 illustrates an example method of providing a compensation signal for the speaker.

In view of the foregoing structural and functional features described above, a method in accordance with various aspects of the present disclosure will be better appreciated with reference to FIG. 8. While, for purposes of simplicity of explanation, the method of FIG. 8 is shown and described as executing serially, it is to be understood and appreciated that the present disclosure is not limited by the illustrated order, as some aspects may, in accordance with the present disclosure, occur in different orders and/or concurrently with other aspects from that shown and described herein. Moreover, not all illustrated features may be required to implement a method in accordance with an aspect of the present disclosure.

FIG. 8 illustrates an example method 800 of providing compensation to enhance performance of a speaker system (e.g., speaker system 100/200/300/400). At 810, audio is produced. The speaker 120/320 produces audio in response to an amplified analog input signal being received at a speaker input 117. At 820, the analog audio input signal $V_{IN}$ is amplified. The amplifier 110 amplifies the analog audio input signal $V_{IN}$ and provides an output 115 to a speaker input (e.g., speaker input 117).

At 830, current passing through the speaker system 100/200/300/400 is sensed (e.g., by current sensor 140). For example, current sensing at 830 produces speaker system 100/200/300/400 a current sensor signal 125 indicative of current passing through the speaker 120.

At 840, a transfer function is applied to the current sensor signal. For example, compensator circuit 130/330/430 applies a transfer function 132 to process the current sensor signal and provide a compensation signal. As disclosed herein, the transfer function is configured to match the resistance and/or inductance of the speaker system 100/200/300/400. The transfer function can also include a gain stage to apply a corresponding gain (e.g., α set from about 0.7 to about 0.8) to provide the compensation signal 135 as feedback that is injected into the analog audio input signal $V_{IN}$.

At 850, the compensation signal 135 is fed back to the input of the amplifier 110. The compensation signal 135 provided by the transfer function 132 at 840 is fed back to the input of the amplifier 110. The compensation signal 135 as feedback is injected into the analog audio input signal $V_{IN}$.

Thus, the speaker system 100/200/300/400 provides speaker equalization that adapts to different speaker types, while adjusting to speaker variations. Moreover, the speaker system 100/200/300/400 improves speaker linearity (e.g., greater than 10 dB improvement), resulting in more sound for a same linearity. The closed loop compensation of speaker system 100/200/300/400 also produces reduced displacement and displacement offset that gives head-room for additional speaker protection and loudness.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A system for driving an audio speaker that has an impedance, the system comprising:
a scaler having an analog input and a scaler output, the scaler operable to attenuate the analog input by a constant attenuation determined based on the audio speaker and output the attenuated analog input at the scaler output;
an amplifier having an amplifier input coupled to the scaler output and an amplifier output;
a current sensor having a sensor input coupled to the speaker and a sensor output, the current sensor configured to generate a sensor signal at the sensor output responsive to a current from the audio speaker; and
a compensator circuit having a circuit input coupled to the sensor output and a circuit output coupled to the amplifier input, the compensator circuit configured to supply a compensation signal to the amplifier input by applying a transfer function to the sensor signal.

2. The system of claim 1, wherein the transfer function is based on the impedance of the audio speaker over a frequency range.

3. The system of claim 1, wherein the compensator circuit includes a resistor corresponding to a resistance component of the impedance.

4. The system of claim 3, wherein the compensator circuit includes an inductor corresponding to an inductance component of the impedance.

5. The system of claim 1, wherein the amplifier is a first amplifier, and the compensator circuit includes a second amplifier configured to adjust the compensation signal responsive to a gain factor.

6. The system of claim 5, wherein the gain factor ranges from 0.7 to 0.8.

7. The system of claim 1, wherein the amplifier is a linear class-D amplifier.

8. The system of claim 1, wherein the current sensor is a shunt resistor current sensor or a flux gate current sensor.

9. The system of claim 1, wherein the speaker is a micro-speaker, and the compensator circuit is configured to generate the compensation signal for reducing displacement of the micro-speaker.

10. The system of claim 1, wherein the speaker is a woofer, and the compensator circuit is configured to generate the compensation signal for mitigating low tonal distortion in the audio generated by the woofer.

11. The system of claim 1, wherein the compensator circuit is configured to flatten sound pressure levels for the speaker.

12. The system of claim 1, wherein the compensator circuit is configured to improve a phase linearity for the speaker.

13. A speaker driver comprising:
a scaler having an input and an attenuated output, the scaler operable to attenuate the input by a constant attenuation and output the attenuated input at the attenuated output;
an amplifier having an input coupled to the scaler output and an output;
a current sensor having a sensor input coupled to a speaker and a sensed speaker current output;
a compensator circuit having an input coupled to the sensed speaker current output, the compensator circuit configured to supply a compensation signal to the amplifier input; and wherein the compensation signal is based on the sensed speaker current output.

14. The speaker driver of claim 13, wherein the compensation signal is determined by applying a transfer function that is based on the impedance of the speaker over a frequency range.

15. The speaker driver of claim 14, wherein the compensator circuit includes a resistor corresponding to a resistance of the impedance.

16. The speaker driver of claim 13, wherein the compensator circuit includes an inductor corresponding to an inductance of the impedance.

17. The speaker driver of claim 13, wherein the current sensor is a shunt resistor current sensor or a flux gate current sensor.

* * * * *